United States Patent
Kono

(10) Patent No.: US 9,812,528 B2
(45) Date of Patent: Nov. 7, 2017

(54) SEMICONDUCTOR DEVICE

(71) Applicant: Kabushiki Kaisha Toshiba, Minato-ku, Tokyo (JP)

(72) Inventor: Hiroshi Kono, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 80 days.

(21) Appl. No.: 14/855,255

(22) Filed: Sep. 15, 2015

(65) Prior Publication Data

US 2016/0276443 A1 Sep. 22, 2016

(30) Foreign Application Priority Data

Mar. 16, 2015 (JP) .................................. 2015-052275

(51) Int. Cl.
*H01L 29/66* (2006.01)
*H01L 29/16* (2006.01)
(Continued)

(52) U.S. Cl.
CPC ...... *H01L 29/1608* (2013.01); *H01L 29/0619* (2013.01); *H01L 29/0696* (2013.01);
(Continued)

(58) Field of Classification Search
CPC ............. H01L 29/1608; H01L 29/0619; H01L 29/42376; H01L 29/42368; H01L 29/7395;
(Continued)

(56) References Cited

U.S. PATENT DOCUMENTS 6,281,549 B1 8/2001 Davies
8,772,111 B2 7/2014 Ikura
(Continued)

FOREIGN PATENT DOCUMENTS

JP 2001-007322 A 1/2001
JP 2006-066438 A 3/2006
(Continued)

OTHER PUBLICATIONS

Taiwanese Office Action dated Sep. 9, 2016 in counterpart Taiwanese patent application No. 104128923 along with English translation.

*Primary Examiner* — Su C Kim
(74) *Attorney, Agent, or Firm* — White & Case LLP

(57) ABSTRACT

A semiconductor device according to an embodiment includes a cell region, a gate connection region, and a cell end region between the cell region and the gate connection region. The cell region includes, an n-type first SiC region, a p-type second SiC region, a n-type third SiC region, a p-type fourth SiC region, a gate insulating film, a gate electrode, a first electrode contacting with the first and fourth SiC regions, a second electrode. The gate connection region includes a p-type fifth SiC region between the third SiC region and a field insulating film and having a peak p-type impurity concentration of $1 \times 10^{18}$ cm$^{-3}$ or more. The cell end region includes a p-type sixth SiC region connected to the fifth SiC region, a p-type seventh SiC region having a higher p-type impurity concentration than the sixth SiC region, the first electrode contacting with the sixth and seventh SiC regions.

6 Claims, 6 Drawing Sheets

(51) Int. Cl.
  *H01L 29/06* (2006.01)
  *H01L 29/167* (2006.01)
  *H01L 29/78* (2006.01)
  *H01L 29/739* (2006.01)
  *H01L 29/10* (2006.01)
  *H01L 29/08* (2006.01)
  *H01L 29/423* (2006.01)
  *H01L 29/45* (2006.01)

(52) U.S. Cl.
  CPC ........ *H01L 29/086* (2013.01); *H01L 29/0878* (2013.01); *H01L 29/1095* (2013.01); *H01L 29/167* (2013.01); *H01L 29/42364* (2013.01); *H01L 29/42368* (2013.01); *H01L 29/42376* (2013.01); *H01L 29/7395* (2013.01); *H01L 29/7802* (2013.01); *H01L 29/45* (2013.01)

(58) Field of Classification Search
  CPC ............ H01L 29/1095; H01L 29/0696; H01L 29/0878; H01L 29/42364; H01L 29/7802; H01L 29/167; H01L 29/086; H01L 29/45
  See application file for complete search history.

(56) References Cited

U.S. PATENT DOCUMENTS

| | | |
|---|---|---|
| 2007/0045700 A1 | 3/2007 | Ohtani et al. |
| 2011/0207321 A1* | 8/2011 | Fujiwara ............... H01L 21/324 438/663 |
| 2011/0210392 A1* | 9/2011 | Nakata ............. H01L 29/41758 257/341 |
| 2011/0284874 A1* | 11/2011 | Miura ................. H01L 29/4916 257/77 |
| 2011/0284923 A1 | 11/2011 | Kamata |
| 2012/0205669 A1* | 8/2012 | Miura ................. H01L 29/1095 257/77 |
| 2013/0137253 A1 | 5/2013 | Kono et al. |
| 2013/0187240 A1 | 7/2013 | Takano |
| 2014/0284622 A1 | 9/2014 | Shimizu et al. |
| 2014/0299888 A1 | 10/2014 | Nakao et al. |
| 2015/0108501 A1 | 4/2015 | Iwamuro et al. |
| 2015/0263115 A1 | 9/2015 | Hiyoshi et al. |

FOREIGN PATENT DOCUMENTS

| | | |
|---|---|---|
| JP | 2007-149924 A | 6/2007 |
| JP | 2014-107419 A | 6/2014 |
| JP | 2014-150279 A | 8/2014 |

\* cited by examiner

SEMICONDUCTOR DEVICE

CROSS-REFERENCE TO RELATED APPLICATION

This application is based upon and claims the benefit of priority from Japanese Patent Application No. 2015-052275, filed on Mar. 16, 2015, the entire contents of which are incorporated herein by reference.

FIELD

Embodiments described herein relate generally to semiconductor devices.

BACKGROUND

Silicon carbide (SiC) is expected as a material for a next-generation semiconductor device. The bandgap of SiC is three times wider than that of silicon (Si), the breakdown field strength thereof is about ten times higher than that of Si, and the thermal conductivity thereof is about three times higher than that of Si. The use of these characteristics makes it possible to achieve a semiconductor device which has low power loss and can operate at a high temperature.

When a surge voltage is applied between electrodes of a metal oxide semiconductor field effect transistor (MOSFET), avalanche breakdown occurs. For example, when the avalanche breakdown occurs at a region, which is unexpected in device design, other than a cell region, there is a concern that the device will be broken.

SiC has characteristics that, for example, the sheet resistance of a p-type impurity region or contact resistance with the p-type impurity region is high, as compared to Si. A device needs to be designed considering the characteristics of SiC in order to improve the avalanche tolerance of the device.

DETAILED DESCRIPTION

Figure 1:
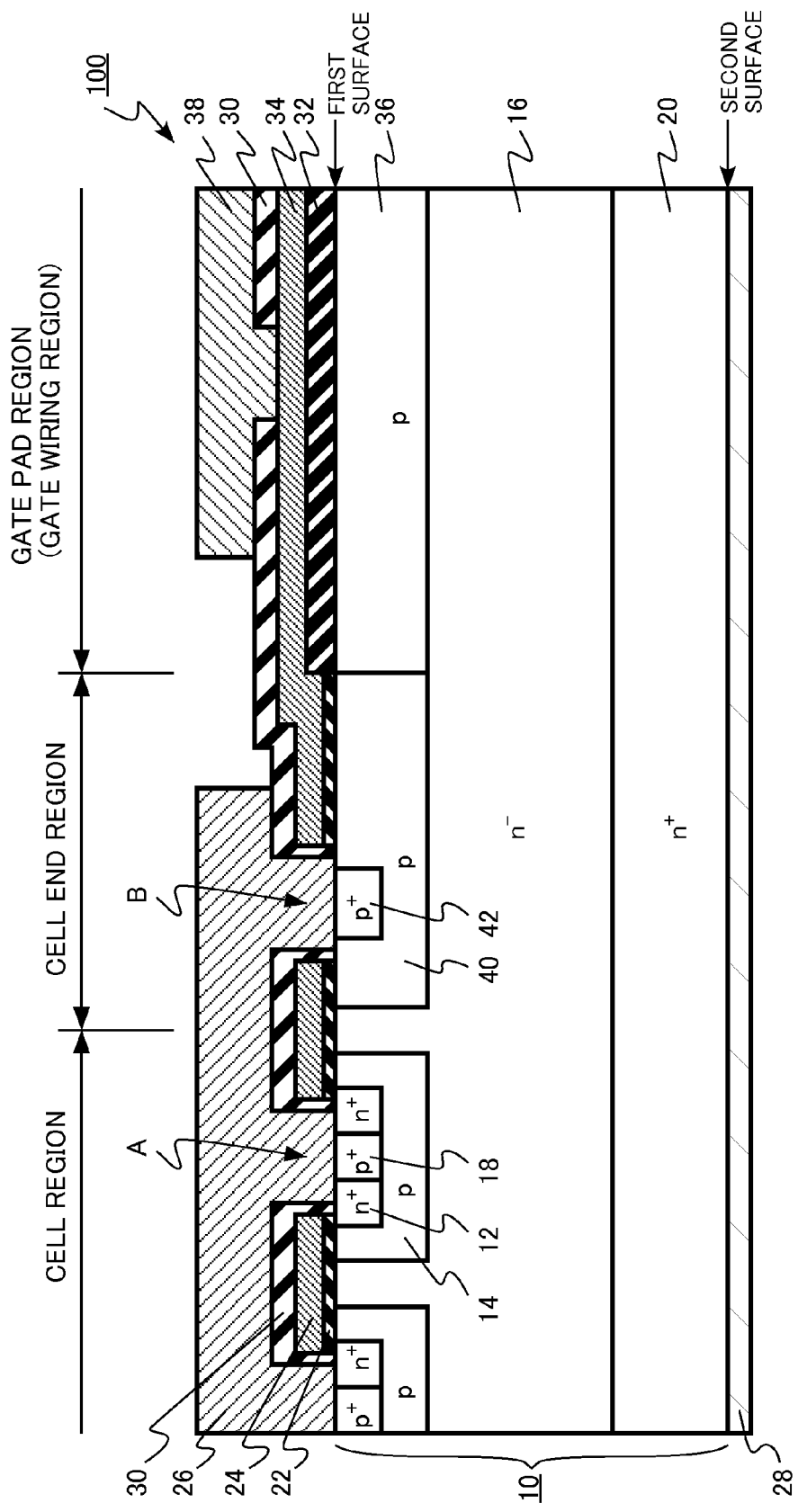
FIG. 1 is a cross-sectional view schematically illustrating a semiconductor device according to a first embodiment.

A semiconductor device according to an embodiment includes a cell region, a gate connection region, and a cell end region provided between the cell region and the gate connection region. The cell region includes: an n-type first SiC region provided at a first surface of a SiC substrate having the first surface and a second surface; a p-type second SiC region provided between the first SiC region and the second surface; a first region of an n-type third SiC region provided between the second SiC region and the second surface; a p-type fourth SiC region provided at the first surface in the second SiC region and having a higher p-type impurity concentration than the second SiC region; a gate insulating film provided on the second SiC region; a first gate electrode provided on the gate insulating film; a first electrode region of a first electrode provided on the first surface, the first electrode region contacting with the first SiC region and the fourth SiC region; and a second electrode provided at the second surface. The gate connection region includes: a field insulating film provided on the first surface and thicker than the gate insulating film; a second gate electrode provided on the field insulating film; and a p-type fifth SiC region provided between a second region of the third SiC region and the field insulating film, the fifth SiC region contacting with the first surface and having a peak p-type impurity concentration of $1\times10^{18}$ cm$^{-3}$ or more. The cell end region includes: a sixth p-type SiC region connected to the fifth SiC region; a seventh p-type SiC region that is provided in the first surface in the sixth SiC region and has a higher p-type impurity concentration than the sixth SiC region; and the first electrode that contacts with the sixth SiC region and the seventh SiC region.

Hereinafter, embodiments of the invention will be described with reference to the drawings. In the following description, the same or similar members are denoted by the same reference numerals and the description thereof will not be repeated.

In the following description, n$^+$, n, n$^-$, p$^+$, p, and p$^-$ indicate the relative impurity concentration levels of each conductivity type. That is, n$^+$ indicates that an n-type impurity concentration is high, as compared to n, and n$^-$ indicates that an n-type impurity concentration is low, as compared to n. In addition, p$^+$ indicates that a p-type impurity concentration is high, as compared to p, and p$^-$ indicates that a p-type impurity concentration is low, as compared to p. In addition, in some cases, an n$^+$ type and an n$^-$ type are simply referred to as an n type and a p$^+$ type and a p$^-$ type are simply referred to as a p type.

Impurity concentration can be measured by, for example, secondary ion mass spectrometry (SIMS). In addition, the relative impurity concentration level can be determined from the carrier concentration level calculated by, for example, scanning capacitance microscopy (SCM).

In the specification, the concept of a "SiC substrate" includes, for example, a SiC layer which is formed on a substrate by epitaxial growth.

First Embodiment

A semiconductor device according to this embodiment includes a cell region, a gate connection region, and a cell end region provided between the cell region and the gate connection region. The cell region includes a SiC substrate having a first surface and a second surface, a first n-type SiC region provided in the first surface of the SiC substrate, a second p-type SiC region provided between the first SiC region and the second surface, a third n-type SiC region provided between the second SiC region and the second surface, a fourth p-type SiC region that is provided in the first surface in the second SiC region and has a higher p-type impurity concentration than the second SiC region, a gate insulating film provided on the second SiC region in the first surface, a first gate electrode provided on the gate insulating film, a first electrode provided on the first surface so as to contact with the first SiC region and the fourth SiC region in a first contact portion, and a second electrode provided on the second surface. The gate connection region includes a field insulating film that is provided on the first surface and is thicker than the gate insulating film, a second gate electrode provided on the field insulating film, and a fifth p-type SiC region that is provided between the third SiC region and the field insulating film so as to contact with the first surface. The cell end region includes a sixth p-type SiC region connected to the fifth SiC region, a seventh p-type SiC region that is provided in the sixth SiC region and has a higher p-type impurity concentration than the sixth SiC region, and the first electrode that contacts with the seventh SiC region in a second contact portion. The entire portion of the first surface, which contacts with the first electrode in the second contact portion, is a p-type SiC region.

FIG. 1 is a cross-sectional view schematically illustrating the semiconductor device according to this embodiment. The semiconductor device according to this embodiment is a MOSFET.

A MOSFET 100 is formed using a SiC substrate 10. The MOSFET 100 has a cell region, a cell end region, and a gate connection region. The gate connection region is a gate pad region or a gate wiring region.

In the cell region, a plurality of cells of a vertical MOSFET are regularly arranged. The shape and arrangement of each cell are not particularly limited.

In the gate pad region, a metal pad electrode for applying a voltage to a gate electrode of each cell in the MOSFET is formed. In the gate wiring region, a metal gate wiring for applying a voltage to the gate electrode of each cell in the MOSFET is formed. The pad electrode and the gate electrode of each cell in the MOSFET are connected to each other by the gate wiring. The gate wiring region is also referred to as a gate finger region. The gate pad region and the gate wiring region basically have the same layer structure. Therefore, hereinafter, the gate pad region will be described as an example.

The cell end region is provided between the cell region and the gate pad region or the gate wiring region. A structure for extracting the gate electrode of each cell of the MOSFET in the cell region to the gate pad region or the gate wiring region is provided.

The MOSFET 100 includes a SiC substrate 10, an n$^+$ source region (first SiC region) 12, a p-type base region (second SiC region) 14, an n$^-$ drift region (third SiC region) 16, a p$^+$ contact region (fourth SiC region) 18, a n$^+$ drain region 20, a gate insulating film 22, a cell gate electrode (first gate electrode) 24, a source electrode (first electrode) 26, a drain electrode (second electrode) 28, and an interlayer insulating film 30 which are provided in the cell region.

The MOSFET 100 includes a field insulating film 32, an extraction gate electrode (second gate electrode) 34, a p-type field p region (fifth SiC region) 36, and a gate pad electrode 38 which are provided in the gate pad region.

In addition, the MOSFET 100 includes a p-type cell end p region (sixth SiC region) 40 and a p-type cell end contact region (seventh SiC region) 42 which are provided in the cell end region.

The SiC substrate 10 has a first surface and a second surface. In FIG. 1, the first surface is an upper surface of the SiC substrate 10. In FIG. 1, the second surface is a lower surface of the SiC substrate 10. The SiC substrate 10 is made of, for example, SiC with a 4H-SiC structure. The thickness of the SiC substrate 10 is, for example, equal to or greater than 100 μm and equal to or less than 500 μm.

The source region (first SiC region) 12 is provided in the first surface of the SiC substrate 10. The source region 12 includes n-type impurities. The n-type impurity is, for example, nitrogen (N). The concentration of the n-type impurities is, for example, equal to or greater than $1\times10^{19}$ cm$^{-3}$ and equal to or less than $5\times10^{20}$ cm$^{-3}$. The depth of the n$^+$ source region 12 is, for example, equal to or greater than 0.1 μm and equal to or less than 0.3 μm.

The p-type base region (second SiC region) 14 is provided between the n$^+$ source region 12 and the second surface. The base region 14 functions as a channel region of the MOSFET 100. The base region 14 includes p-type impurities. The p-type impurity is, for example, aluminum (Al). The concentration of the p-type impurities in the surface of the base region 14 is, for example, equal to or greater than $1\times10^{16}$ cm$^{-3}$ and equal to or less than $5\times10^{17}$ cm$^{-3}$. The peak concentration of the p-type impurities is, for example, equal to or greater than $1\times10^{18}$ cm$^{-3}$ and equal to or less than $1\times10^{19}$ cm$^{-3}$. The depth of the base region 14 is, for example, equal to or greater than 0.6 μm and equal to or less than 1.0 μm.

The n$^-$ drift region (third SiC region) 16 is provided between the base region 14 and the second surface. The drift region 16 includes n-type impurities. The n-type impurity is, for example, nitrogen (N). The n-type impurity concentration and depth of the drift region 16 vary depending on a required element breakdown voltage. For example, when an element with a rated value of 1200 V requires a breakdown voltage of 1400 V to 1700 V, the impurity concentration of the drift region 16 is, for example, equal to or greater than about $7\times10^{15}$ and equal to or less than about $1\times10^{16}$ cm$^{-3}$. In this case, it is preferable that the depth of the drift region 16 be, for example, equal to or greater than 9 μm and equal to or less than 11 μm.

The p$^+$ contact region (fourth SiC region) 18 is provided in the first surface in the base region 14. The contact region 18 has a function of reducing the contact resistance of the source electrode 26 with the base region 14.

The contact region 18 includes p-type impurities. The contact region 18 has a higher p-type impurity concentration than the p-type base region 14. The p-type impurity is, for example, aluminum (Al). The concentration of the p-type impurities is, for example, equal to or greater than $1\times10^{19}$ cm$^{-3}$ and equal to or less than $5\times10^{20}$ cm$^{-3}$. The depth of the contact region 18 is, for example, equal to or greater than 0.1 μm and equal to or less than 0.3 μm.

The n$^+$ drain region 20 is provided in the second surface of the SiC substrate 10. The drain region 20 includes n-type impurities. The n-type impurity is, for example, nitrogen (N). The concentration of the n-type impurities is, for example, equal to or greater than $5\times10^{18}$ and equal to or less than $1\times10^{20}$ cm$^{-3}$. The thickness of the drain region 20 is, for example, equal to or greater than 100 μm and equal to or less than 500 μm.

The gate insulating film 22 is provided on the first surface of the SiC substrate 10. The gate insulating film 22 is provided on the p-type base region 14. The gate insulating film 22 is, for example, a silicon oxide film.

The cell gate electrode (first gate electrode) 24 is provided on the gate insulating film 22. The cell gate electrode 24 is made of, for example, polycrystalline silicon doped with impurities.

The interlayer insulating film 30 is provided on the cell gate electrode 24. The interlayer insulating film 30 is, for example, a silicon oxide film.

The source electrode (first electrode) 26 is provided on the first surface side of the SiC substrate 10. The source electrode 26 is provided on the interlayer insulating film 30. The source electrode 26 contacts with the source region 12 and the contact region 18 in a first contact portion A of the cell region.

The source electrode 26 is made of, for example, metal. The source electrode 26 is, for example, a stacked film of titanium (Ti) and aluminum (Al).

A silicide layer may be provided in a portion of the source electrode 26 which contacts with the source region 12 or the contact region 18. The silicide layer is made of, for example, nickel silicide. It is preferable that the source electrode 26 ohmic contacts with the source region 12 and the contact region 18.

The drain electrode (second electrode) 28 is provided so as to contact with the second surface of the SiC substrate 10. The drain electrode 28 is provided so as to contact with the drain region 20.

The drain electrode 28 is made of, for example, metal. The drain electrode 28 is, for example, a stacked film of titanium (Ti) and nickel (Ni).

A silicide layer may be provided in a portion of the drain electrode 28 which contacts with the drain region 20. The silicide layer is made of, for example, nickel silicide. It is preferable that a contact between the drain electrode 28 and the drain region 20 be an ohmic contact.

The field insulating film 32 is provided on the first surface in the gate pad region. The field insulating film 32 is thicker than the gate insulating film 22. The field insulating film 32 has a function of insulating the SiC substrate 10 from the extraction gate electrode (second gate electrode) 34. The field insulating film 32 is, for example, an oxide film. The field insulating film 32 is, for example, a silicon oxide film.

The extraction gate electrode (second gate electrode) 34 is provided on the field insulating film 32. The extraction gate electrode 34 is provided in order to extract the cell gate electrode 24 from the cell region to the gate pad region. The extraction gate electrode 34 is made of, for example, polycrystalline silicon doped with impurities. The extraction gate electrode 34 is connected to the cell gate electrode 24 on the front or back side of the plane of FIG. 1. The connection is performed by, for example, polycrystalline silicon or a laminate of polycrystalline silicon and a metal film.

The p-type field p region (fifth SiC region) 36 is provided between the drift region 16 and the field insulating film 32. The field p region 36 has a function of reducing the electric field which is applied to the field insulating film 32 when the MOSFET 100 is turned off and preventing the dielectric breakdown of the field insulating film 32.

The field p region 36 includes p-type impurities. The p-type impurity is, for example, aluminum (Al). The peak concentration of the p-type impurities in the field p region 36 is equal to or greater than $1 \times 10^{18}$ cm$^{-3}$.

The field p region 36 needs not to be completed when the MOSFET 100 is turned off, in order to reduce the electric field applied to the field insulating film 32. The peak concentration of the p-type impurities in the field p region 36 needs to be equal to or greater than $1 \times 10^{18}$ cm$^{-3}$ in order to prevent the field p region 36 from being completely depleted. The peak concentration of the p-type impurities in the field p region 36 is preferably equal to or greater than $5 \times 10^{18}$ cm$^{-3}$ and more preferably equal to or greater than $1 \times 10^{19}$ cm$^{-3}$.

The depth of the field p region 36 is, for example, equal to or greater than 0.4 μm and equal to or less than 1.0 μm.

The gate pad electrode 38 is provided on the interlayer insulating film 30 in the gate pad region. The gate pad electrode 38 has a function of applying a gate potential to the cell gate electrode 24. The gate pad electrode 38 is connected to the extraction gate electrode 34.

The gate pad electrode 38 is made of, for example, metal. The gate pad electrode 38 is, for example, a stacked film of titanium (Ti) and aluminum (Al).

The p-type cell end p region (sixth SiC region) 40 is provided in the cell end region. The cell end p region 40 is connected to the field p region 36. The cell end p region 40 includes p-type impurities. The p-type impurity is, for example, aluminum (Al). The concentration of the p-type impurities in the surface of the cell end p region 40 is, for example, equal to or greater than $1 \times 10^{16}$ cm$^{-3}$ and equal to or less than $5 \times 10^{17}$ cm$^{-3}$. The peak concentration of the p-type impurities is, for example, equal to or greater than $1 \times 10^{18}$ cm$^{-3}$ and equal to or less than $1 \times 10^{19}$ cm$^{-3}$. The depth of the cell end p region 40 is, for example, equal to or greater than 0.6 μm and equal to or less than 1.0 μm. The cell end p region 40 has substantially the same p-type impurity concentration and depth as, for example, the base region 14 in the cell region.

The p-type cell end contact region (seventh SiC region) 42 is provided in the cell end p region 40. The cell end contact region 42 is provided in the first surface. The cell end contact region 42 has a function of reducing the contact resistance of the source electrode 26 with the cell end p region 40.

The cell end contact region 42 includes p-type impurities. The cell end contact region 42 has a higher p-type impurity concentration than the cell end p region 40. The p-type impurity is, for example, aluminum (Al). The concentration of the p-type impurities is, for example, equal to or greater than $1 \times 10^{19}$ cm$^{-3}$ and equal to or less than $5 \times 10^{20}$ cm$^{-3}$. The depth of the cell end contact region 42 is, for example, equal to or greater than 0.1 μm and equal to or less than 0.3 μm. The cell end contact region 42 has substantially the same p-type impurity concentration and depth as, for example, the contact region 18.

The source electrode 26 contacts with the cell end contact region 42 in a second contact portion B of the cell end region. In the second contact portion B, the entire contact portion of the first surface with the source electrode 26 is a p-type SiC region. In other words, there is no n-type SiC region in the contact portion of the first surface with the source electrode 26.

Figure 2:
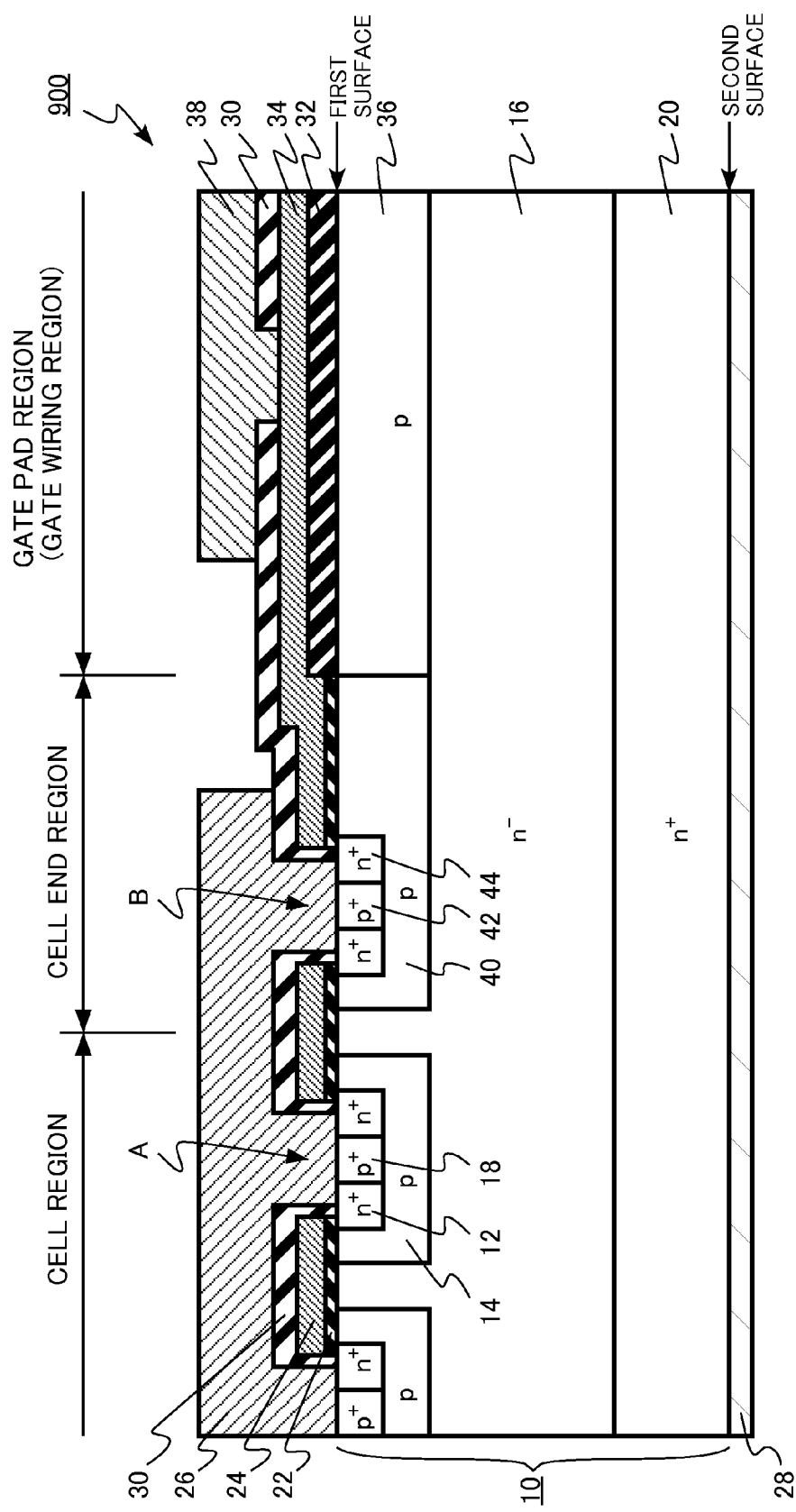
FIG. 2 is a cross-sectional view schematically illustrating a semiconductor device according to a comparative example.

Next, the function and effect of this embodiment will be described. FIG. 2 is a cross-sectional view schematically illustrating a semiconductor device according to a comparative example.

The semiconductor device according to the comparative example is a MOSFET. A MOSFET 900 is similar to the MOSFET 100 according to the first embodiment except that an n-type cell end contact region 44 is provided in a contact portion of the first surface with the source electrode 26 in the second contact portion B of the cell end region.

In the MOSFET 900, an impurity region below the second contact portion B has the same structure as an impurity region below the first contact portion A. In order to improve the process consistency between the cell region and the cell end region, the impurity regions having the same structure are formed.

The field p region 36 in the gate pad region is wider than the base region 14 in the cell region. The contact of the source electrode 26 for suppressing the potential of the field p region 36 is only provided in the second contact portion B of the cell end region.

Therefore, when a surge voltage is applied between the source electrode 26 and the drain electrode 28 in the MOSFET 900, particularly, the potential of the field p region 36 which is away from the second contact portion B increases and there is a concern that avalanche breakdown will occur in the gate pad region. In this case, a large amount of current is concentrated on the second contact portion B and there is a concern that the device will be broken in the second contact portion B. Therefore, the avalanche tolerance of the MOSFET 900 is reduced.

When avalanche breakdown occurs in the gate pad region, there is a concern that a parasitic transistor in the cell end region will operate due to a hole current which flows through the second contact portion B. In this case, a large amount of current is concentrated on the second contact portion B and there is a concern that the device will be broken in the second contact portion B. Therefore, the avalanche tolerance of the MOSFET 900 is reduced.

The parasitic transistor in the cell end region is an npn transistor formed by the n-type cell end contact region 44, the p-type cell end p region 40, and the n⁻ drift region 16. When a hole current flows to the cell end p region 40 which corresponds to the base of the npn transistor and is connected to the field p region 36, there is a concern that the npn transistor will be turned on.

In particular, in SiC, it is difficult to reduce, for example, the sheet resistance of a p-type impurity region or contact resistance with the p-type impurity region, as compared to Si. Therefore, it is also difficult to reduce the sheet resistance of the field p region 36 and avalanche breakdown is likely to occur in the gate pad region. In addition, it is difficult to reduce the contact resistance of the second contact portion B and to prevent breakdown when a large amount of current flows.

In the MOSFET 100 according to this embodiment, there is no n-type SiC region in the contact portion of the first surface with the source electrode 26. Specifically, the source electrode 26 contacts with only the p-type cell end contact region 42. As a result, effective contact resistance with the cell end p region 40 is reduced, as compared to the MOSFET 900 according to the comparative example.

Therefore, even when a large amount of current flows to the second contact portion B, the breakdown of the device is prevented in the second contact portion B. As a result, the avalanche tolerance of the MOSFET 100 is improved.

In addition, since the effective contact resistance with the cell end p region 40 is reduced, it is possible to prevent an increase in the potential of the field p region 36. Therefore, avalanche breakdown is less likely to occur in the gate pad region. As a result, the avalanche tolerance of the MOSFET 100 is improved.

According to the MOSFET 100 of this embodiment, the breakdown of the contact portion in the cell end region is prevented when avalanche breakdown occurs. In addition, it is possible to prevent an increase in the potential of the field p region 36. Therefore, the MOSFET 100 with high avalanche tolerance is achieved.

It is preferable to provide an n-type region having a higher n-type impurity concentration than the drift region 16 between the base region 14 and the drift region 16 and between the cell end p region 40 and the drift region 16. When the n-type region is provided, the breakdown voltage of the cell region and the cell end region is reduced. Therefore, avalanche breakdown is less likely to occur in the gate pad region. As a result, the avalanche tolerance of the MOSFET 100 is further improved. The n-type region can be formed by, for example, the implantation of nitrogen (N) ions.

Second Embodiment

A semiconductor device according to this embodiment includes a cell region, a gate connection region, and a cell end region provided between the cell region and the gate connection region. The cell region includes a SiC substrate having a first surface and a second surface, a first n-type SiC region provided in the first surface of the SiC substrate, a second p-type SiC region provided between the first SiC region and the second surface, a third n-type SiC region provided between the second SiC region and the second surface, a fourth p-type SiC region that is provided in the first surface in the second SiC region and has a higher p-type impurity concentration than the second SiC region, a gate insulating film provided on the second SiC region in the first surface, a first gate electrode provided on the gate insulating film, a first electrode provided on the first surface so as to contact with the first SiC region and the fourth SiC region in a first contact portion, and a second electrode provided on the second surface. The gate connection region includes a field insulating film that is provided on the first surface and is thicker than the gate insulating film, a second gate electrode provided on the field insulating film, and a fifth p-type SiC region that is provided between the third SiC region and the field insulating film so as to contact with the first surface, has a higher p-type impurity concentration than the second SiC region provided between the first gate electrode and the second surface, and has a peak p-type impurity concentration of $1 \times 10^{18}$ cm⁻³ or more. The cell end region includes a sixth p-type SiC region connected to the fifth SiC region, a seventh p-type SiC region that is provided in the first surface in the sixth SiC region and has a higher p-type impurity concentration than the sixth SiC region, and the first electrode that contacts with the seventh SiC region in a second contact portion.

The semiconductor device according to this embodiment differs from the semiconductor device according to the first embodiment in that the p-type impurity concentration of the fifth SiC region is higher than the p-type impurity concentration of the second SiC region provided between the first gate electrode and the second surface. In addition, the semiconductor device according to this embodiment differs from the semiconductor device according to the first embodiment in that an n-type cell end contact region is provided in the second contact portion B. Hereinafter, the description of the same content as that in the first embodiment will not be repeated.

Figure 3:
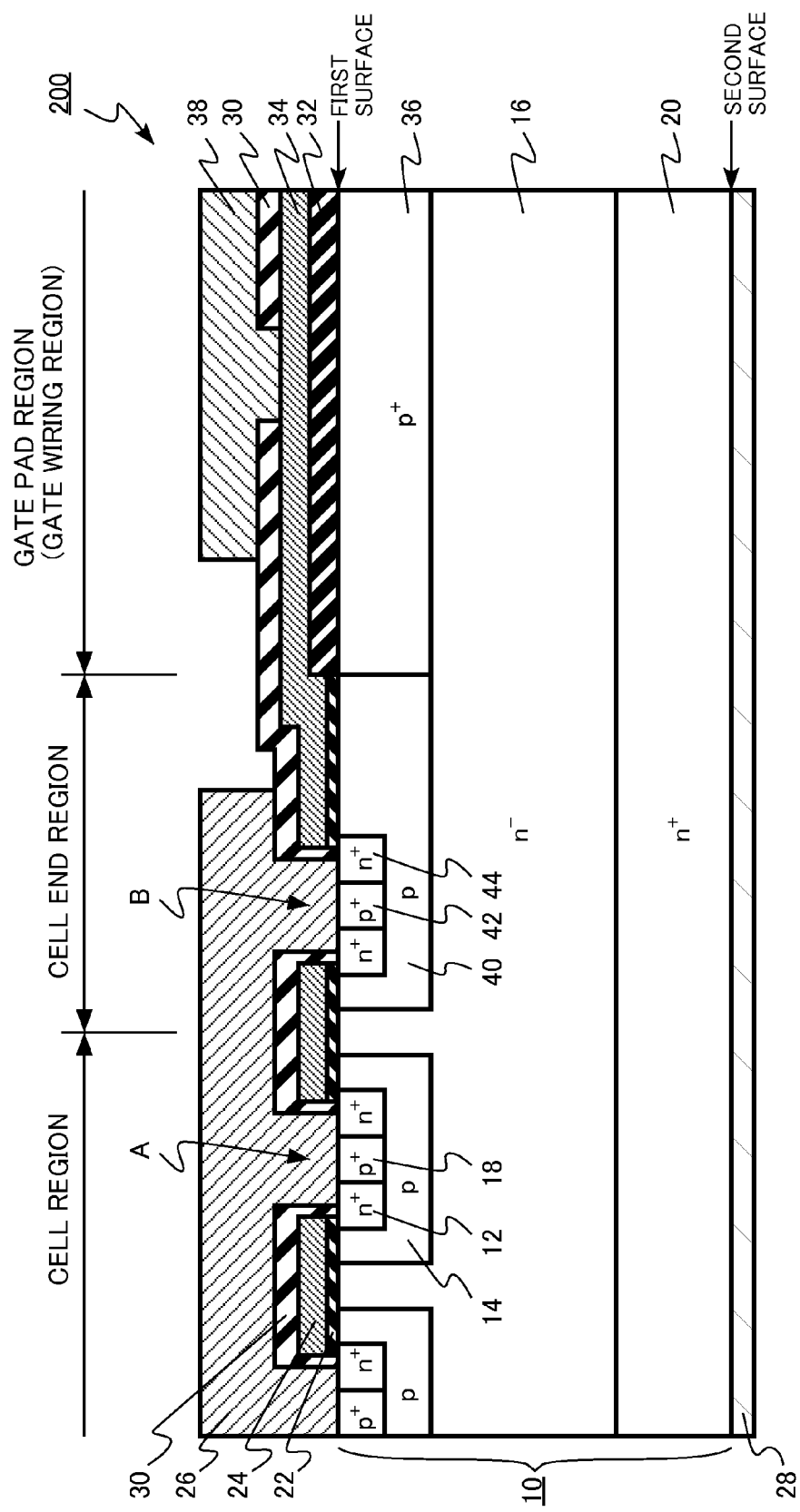
FIG. 3 is a cross-sectional view schematically illustrating a semiconductor device according to a second embodiment.

FIG. 3 is a cross-sectional view schematically illustrating the semiconductor device according to this embodiment. The semiconductor device according to this embodiment is a MOSFET.

In a MOSFET 200, the p-type impurity concentration of a p-type field p region (fifth SiC region) 36 is higher than the p-type impurity concentration of a p-type base region (second SiC region) 14 provided between a cell gate electrode (first electrode) 24 and a second surface. Specifically, in the MOSFET 200, the peak concentration of p-type impurities in the p-type field p region 36 is higher than the peak concentration of p-type impurities in the p-type base region 14 provided between the cell gate electrode 24 and the drift region 16. Alternatively, the average concentration of the p-type impurities in the p-type field p region 36 is higher than the average concentration of the p-type impurities in the p-type base region 14 provided between the cell gate electrode 24 and the drift region 16.

The peak concentration of the p-type impurities in the field p region 36 is equal to or greater than $1 \times 10^{18}$ cm⁻³. The peak concentration of the p-type impurities in the field p region 36 is preferably equal to or greater than $5 \times 10^{18}$ cm⁻³ and more preferably equal to or greater than $1 \times 10^{19}$ cm⁻³.

When the peak concentration of the p-type impurities in the field p region 36 is set in the above-mentioned range, the effect of reducing sheet resistance is obtained. In addition, the effect of preventing the field p region 36 from being completely depleted is obtained.

The peak concentration of the p-type impurities in the p-type base region 14 provided between the cell gate electrode 24 and the drift region 16 is preferably equal to or greater than $1\times10^{18}$ cm$^{-3}$, more preferably equal to or greater than $5\times10^{18}$ cm$^{-3}$, and most preferably equal to or greater than $1\times10^{19}$ cm$^{-3}$.

According to the MOSFET 200 of this embodiment, the p-type impurity concentration of the field p region 36 increases to reduce the sheet resistance of the field p region 36. The sheet resistance of the field p region 36 is lower than the sheet resistance of the base region 14. Therefore, even when a surge voltage is applied between the source electrode 26 and the drain electrode 28, the potential of the field p region 36 is less likely to increase. As a result, the occurrence of avalanche breakdown is prevented in the gate pad region or the cell end region.

It has been known that the dielectric breakdown voltage of an insulating film, particularly, a silicon oxide film on a SiC substrate is reduced as the p-type impurity concentration, particularly, aluminum (Al) concentration of an interface with the SiC substrate increases.

Therefore, it is preferable that the distance of the peak position of the p-type impurity concentration of the field p region 36 from the first surface be equal to or greater than 0.1 µm in order to reduce the p-type impurity concentration of the field p region 36 in the first surface and to prevent a reduction the dielectric breakdown voltage of the field oxide film 32. In addition, it is preferable that the distance of the peak position from the first surface be equal to or less than 0.3 µm in order to easily form a high-concentration region using ion implantation.

The peak concentration of the p-type impurities in the field p region 36 is preferably equal to or less than $1\times10^{20}$ cm$^{-3}$ and more preferably equal to or less than $5\times10^{19}$ cm$^{-3}$ in order to prevent a reduction the dielectric breakdown voltage of the field oxide film 32.

The p-type impurity concentration of the field p region 36 in the first surface is preferably equal to or less than $5\times10^{18}$ cm$^{-3}$ and more preferably equal to or less than $1\times10^{18}$ cm$^{-3}$ in order to prevent a reduction the dielectric breakdown voltage of the field oxide film 32.

According to the MOSFET 200 of this embodiment, the occurrence of avalanche breakdown in the gate pad region or the gate wiring region is prevented. Therefore, the MOSFET 200 with high avalanche tolerance is achieved.

It is preferable to provide an n-type region having a higher n-type impurity concentration than the drift region 16 between the base region 14 and the drift region 16 and between the cell end p region 40 and the drift region 16. When the n-type region is provided, the breakdown voltage of the cell region and the cell end region is reduced. Therefore, avalanche breakdown is less likely to occur in the gate pad region. As a result, the avalanche tolerance of the MOSFET 200 is further improved. The n-type region can be formed by, for example, the implantation of nitrogen (N) ions.

Third Embodiment

A semiconductor device according to this embodiment includes cell region, a gate connection region, and a cell end region provided between the cell region and the gate connection region. The cell region includes a SiC substrate having a first surface and a second surface, a first n-type SiC region provided in the first surface of the SiC substrate, a second p-type SiC region provided between the first SiC region and the second surface, a third n-type SiC region provided between the second SiC region and the second surface, a fourth p-type SiC region that is provided in the first surface in the second SiC region and has a higher p-type impurity concentration than the second SiC region, a gate insulating film provided on the second SiC region in the first surface, a first gate electrode provided on the gate insulating film, a first electrode provided on the first surface so as to contact with the first SiC region and the fourth SiC region in a first contact portion, and a second electrode provided on the second surface. The gate connection region includes a field insulating film that is provided on the first surface and is thicker than the gate insulating film, a second gate electrode provided on the field insulating film, and a fifth p-type SiC region that is provided between the third SiC region and the field insulating film so as to contact with the first surface, is shallower than the second SiC region, and has a peak p-type impurity concentration of $1\times10^{18}$ cm$^{-3}$ or more. The cell end region includes a sixth p-type SiC region connected to the fifth SiC region, a seventh p-type SiC region that is provided in the first surface in the sixth SiC region and has a higher p-type impurity concentration than the sixth SiC region, and the first electrode that contacts with the seventh SiC region in a second contact portion.

The semiconductor device according to this embodiment differs from the semiconductor device according to the first embodiment in that the depth of the fifth SiC region is less than the depth of the second SiC region. In addition, the semiconductor device according to this embodiment differs from the semiconductor device according to the first embodiment in that an n-type cell end contact region is provided in the second contact portion B. Hereinafter, the description of the same content as that in the first embodiment will not be repeated.

Figure 4:
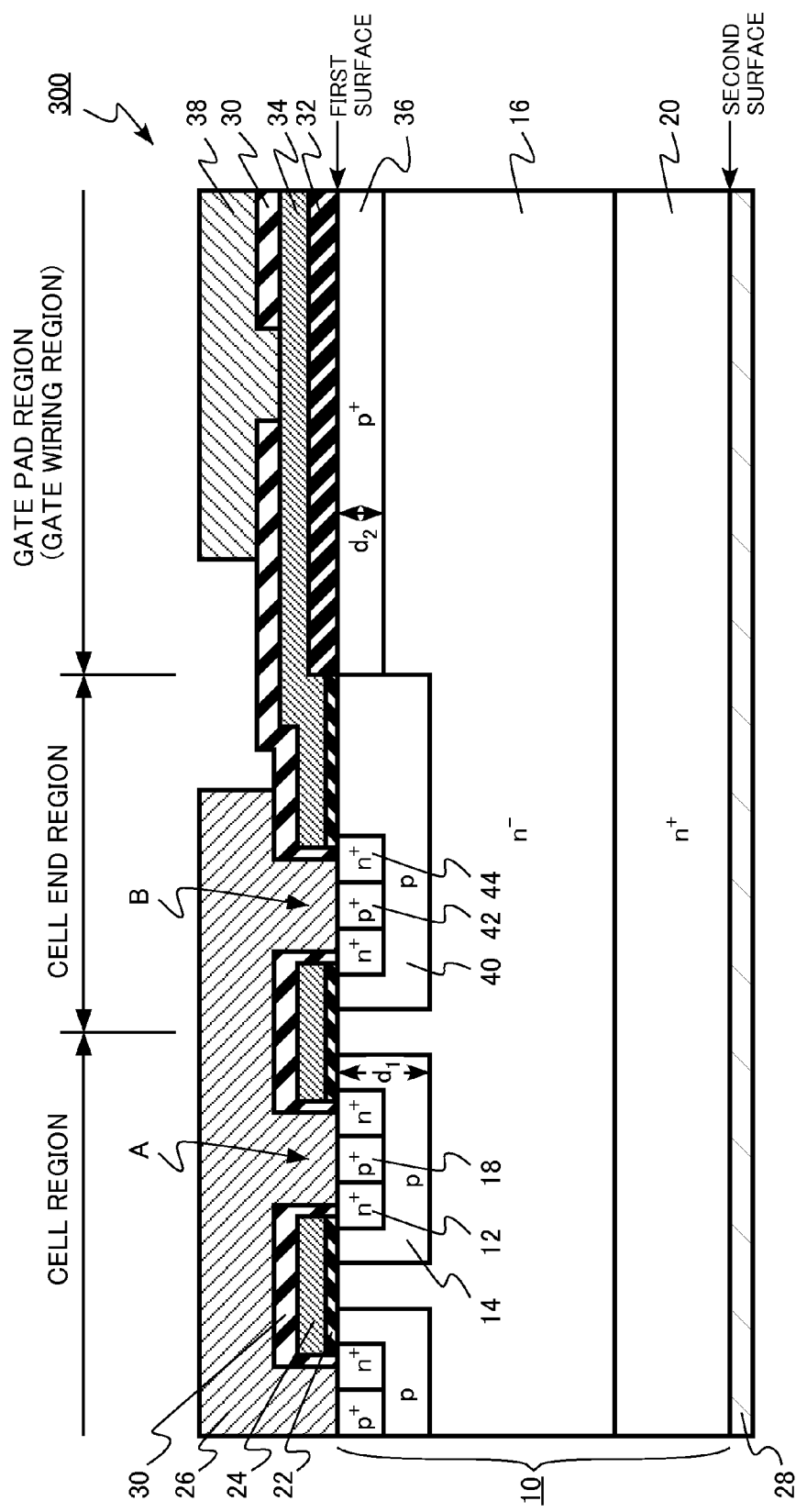
FIG. 4 is a cross-sectional view schematically illustrating a semiconductor device according to a third embodiment.

FIG. 4 is a cross-sectional view schematically illustrating the semiconductor device according to this embodiment. The semiconductor device according to this embodiment is a MOSFET.

In a MOSFET 300, the depth ("$d_2$" in FIG. 4) of a p-type field p region (fifth SiC region) 36 is less than the depth ("$d_1$" in FIG. 4) of a p-type base region (second SiC region) 14.

Therefore, the thickness of a drift region 16 below the field p region 36 is greater than the thickness of the drift region 16 below the base region 14.

According to the MOSFET 300 of this embodiment, the thickness of the drift region 16 in the gate pad region or the gate wiring region is greater than the thickness of the drift region 16 in the cell region. Therefore, a junction breakdown voltage in the gate pad region or the gate wiring region increases. As a result, the occurrence of avalanche breakdown in the gate pad region or in the gate wiring region is prevented.

It is preferable that the depth ("$d_2$" in FIG. 4) of the field p region 36 be equal to or greater than half the depth ("$d_1$" in FIG. 4) of the base region 14, in order to increase the junction breakdown voltage in the gate pad region or the gate wiring region.

It is preferable that the depth ("$d_2$" in FIG. 4) of the field p region 36 be less than the depth ("$d_1$" in FIG. 4) of the base region 14 by 0.1 µm or more in order to increase the junction breakdown voltage in the gate pad region or the gate wiring region. It is more preferable that the depth of the field p region 36 be less than the depth of the base region 14 by 0.3 µm or more.

The distance between the second contact portion B and the field p region 36 is preferably equal to or less than 5 µm and more preferably equal to or less than 3 µm, in order to reduce the width of the p-type cell end p region (sixth SiC region) 40 which is a low breakdown voltage region, as compared to the field p region 36.

The peak concentration of the p-type impurities in the field p region 36 is preferably equal to or greater than $5 \times 10^{18}$ cm$^{-3}$ and more preferably equal to or greater than $1 \times 10^{19}$ cm$^{-3}$ in order to prevent the field p region 36 from being completely depleted.

According to the MOSFET 300 of this embodiment, the occurrence of avalanche breakdown in the gate pad region or the gate wiring region is prevented. Therefore, the MOSFET 300 with high avalanche tolerance is achieved.

Fourth Embodiment

A semiconductor device according to this embodiment is similar to the semiconductor device according to the second embodiment except that the n-type cell end contact region is not provided in second contact portion B. Therefore, the description of the same content as that in the second embodiment will not be repeated.

Figure 5:
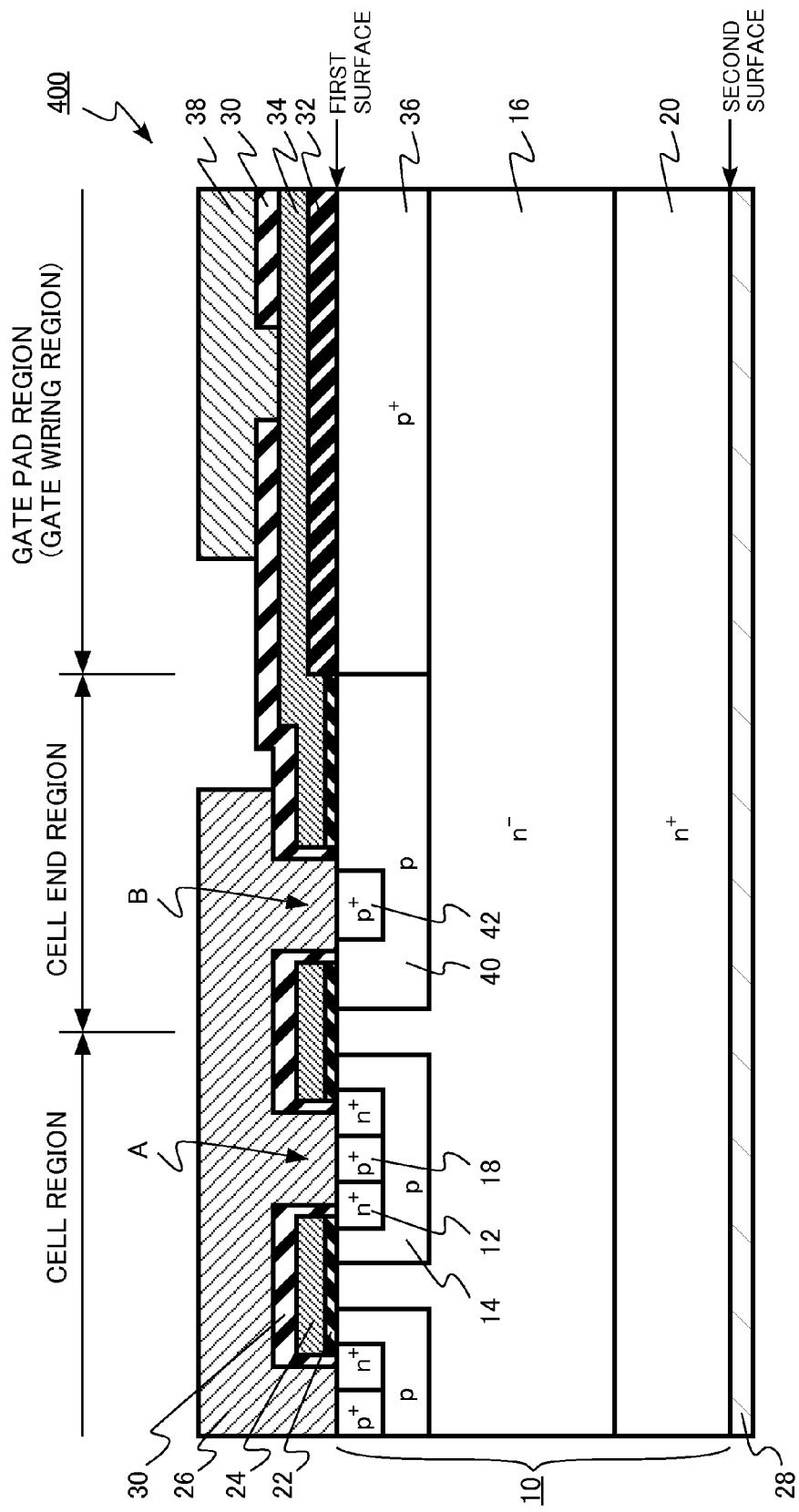
FIG. 5 is a cross-sectional view schematically illustrating a semiconductor device according to a fourth embodiment.

FIG. 5 is a cross-sectional view schematically illustrating the semiconductor device according to this embodiment. The semiconductor device according to this embodiment is a MOSFET.

In a MOSFET 400, the p-type impurity concentration of a p-type field p region (fifth SiC region) 36 is higher than the p-type impurity concentration of a p-type base region (second SiC region) 14 provided between a cell gate electrode (first electrode) 24 and the second surface.

In a second contact portion B, the entire contact portion of the first surface with a source electrode 26 is a p-type SiC region. In other words, there is no n-type SiC region in the contact portion of the first surface with the source electrode 26.

According to the MOSFET 400 of this embodiment, the occurrence of avalanche breakdown in a gate pad region or a gate wiring region is prevented by the same effect as that in the second embodiment. In addition, the breakdown of a contact portion in a cell end region during avalanche breakdown is prevented by the same effect as that in the first embodiment. Therefore, the MOSFET 400 with high avalanche tolerance is achieved.

Fifth Embodiment

A semiconductor device according to this embodiment is similar to the semiconductor device according to the third embodiment except that the n-type cell end contact region is not provided in the second contact portion B. Therefore, the description of the same content as that in the third embodiment will not be repeated.

Figure 6:
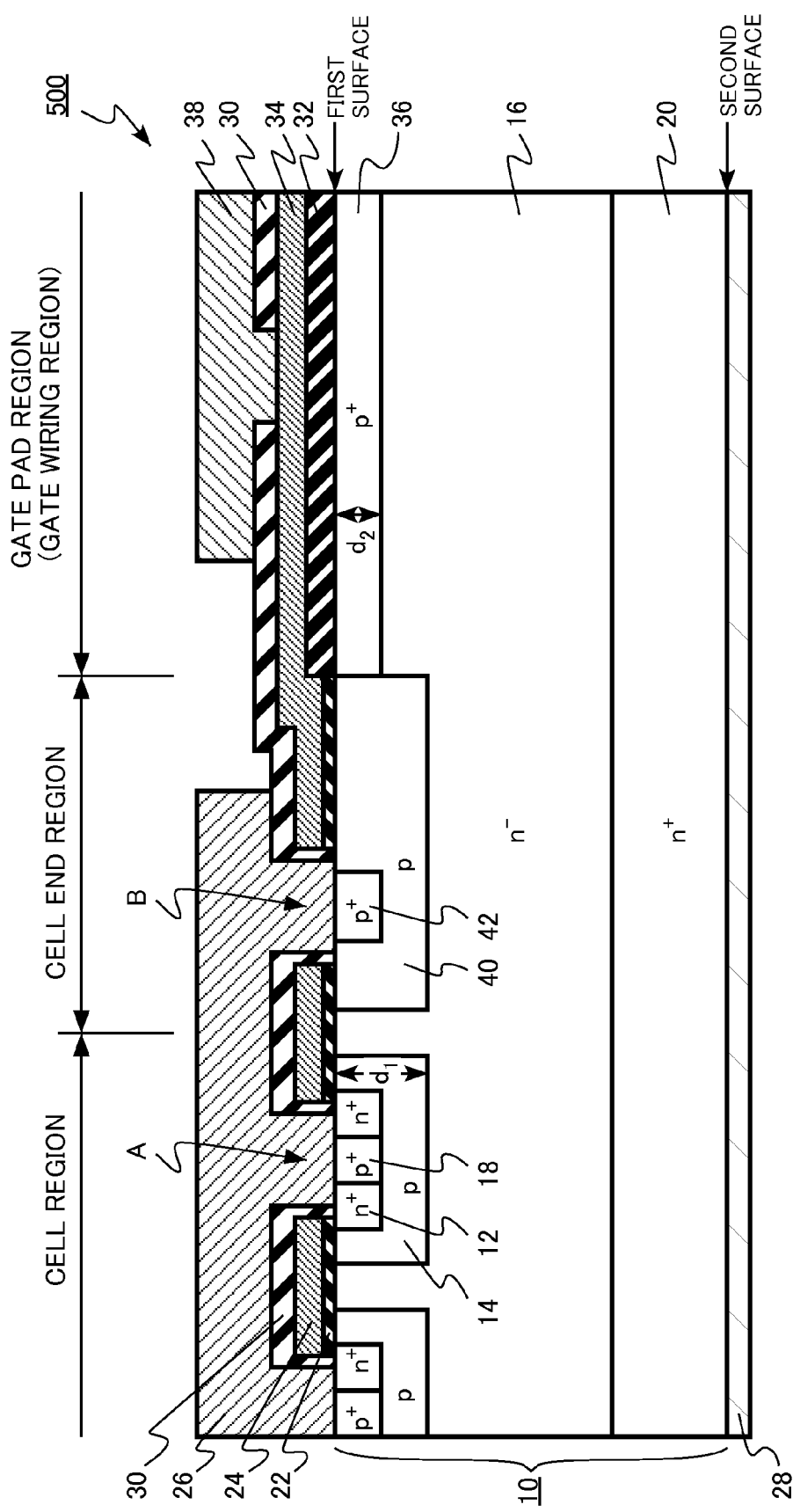
FIG. 6 is a cross-sectional view schematically illustrating a semiconductor device according to a fifth embodiment.

FIG. 6 is a cross-sectional view schematically illustrating the semiconductor device according to this embodiment. The semiconductor device according to this embodiment is a MOSFET.

In a MOSFET 500, the depth ("d$_2$" in FIG. 6) of a p-type field p region (fifth SiC region) 36 is less than the depth ("d$_1$" in FIG. 6) of a p-type base region (second SiC region) 14.

In the second contact portion B, the entire contact portion of the first surface with a source electrode 26 is a p-type SiC region. In other words, there is no n-type SiC region in the contact portion of the first surface with the source electrode 26.

According to the MOSFET 500 of this embodiment, the occurrence of avalanche breakdown in a gate pad region or a gate wiring region is prevented by the same effect as that in the third embodiment. In addition, the breakdown of a contact portion in a cell end region during avalanche breakdown is prevented by the same effect as that in the first embodiment. Therefore, the MOSFET 500 with high avalanche tolerance is achieved.

In the first to fifth embodiments, the planar MOSFET is given as an example of the semiconductor device. However, the invention can also be applied to a trench-type MOSFET in which a gate electrode is provided in a trench.

In the first to fifth embodiments, the MOSFET is given as an example of the semiconductor device. However, the invention can also be applied to an insulated gate bipolar transistor (IGBT).

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a cell region;
   a gate connection region; and
   a cell end region provided between the cell region and the gate connection region,
   the cell region including:
   an n-type first SiC region provided at a first surface of a SiC substrate having the first surface and a second surface;
   a p-type second SiC region provided between the first SiC region and the second surface;
   a first region of an n-type third SiC region provided between the second SiC region and the second surface;
   a p-type fourth SiC region provided at the first surface in the second SiC region and having a higher p-type impurity concentration than the second SiC region;
   a gate insulating film provided on the second SiC region;
   a first gate electrode provided on the gate insulating film;
   a first electrode region of a first electrode provided on the first surface, the first electrode region contacting with the first SiC region and the fourth SiC region; and
   a second electrode provided at the second surface,
   the gate connection region including:
   a field insulating film provided on the first surface and thicker than the gate insulating film;
   a second gate electrode provided on the field insulating film; and
   a p-type fifth SiC region provided between a second region of the third SiC region and the field insulating film, the fifth SiC region contacting with the first surface and having a peak p-type impurity concentration of $1\times10^{18}$ cm$^{-3}$ or more, the cell end region including:
  a p-type sixth SiC region connected to the fifth SiC region;
  a p-type seventh SiC region provided at the first surface in the sixth SiC region and having a higher p-type impurity concentration than the sixth SiC region; and
  a second electrode region of the first electrode contacting with the seventh SiC region,
  wherein the p-type impurity concentration of the fifth SiC region is higher than the p-type impurity concentration of the second SiC region provided between the first gate electrode and the second surface,
  a distance of a peak position of the p-type impurity concentration of the fifth SiC region from the first surface is equal to or greater than 0.1 μm and equal to or less than 0.3 μm, and
  the depth of the fifth SiC region is less than the depth of the second SiC region.

2. The device according to claim 1,
wherein the depth of the fifth SiC region is equal to or less than half the depth of the second SiC region.

3. The device according to claim 1,
wherein the field insulating film is a silicon oxide film.

4. The device according to claim 1,
wherein the p-type impurity of the fifth SiC region is aluminum (Al).

5. The device according to claim 1,
wherein a n-type impurity region does not exist in of the sixth SiC region.

6. The device according to claim 1,
wherein a n-type impurity region does not exist at a portion where the second electrode region contacts with the SiC substrate.

\* \* \* \* \*